US006952709B1

(12) United States Patent
Dujardin et al.

(10) Patent No.: US 6,952,709 B1
(45) Date of Patent: Oct. 4, 2005

(54) RECEIVER, PROGRAMMABLE CIRCUIT AND METHOD OF CALCULATING DIGITAL FILTERS

(75) Inventors: Eric Dujardin, Paris (FR); Olivier Gay-Bellile, Paris (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/510,852

(22) Filed: Feb. 23, 2000

(30) Foreign Application Priority Data

Feb. 26, 1999 (FR) .................................... 99 02456

(51) Int. Cl.$^7$ ............................................ G06F 17/10
(52) U.S. Cl. .................................................... 708/300
(58) Field of Search ................................ 708/301, 316, 708/300, 305, 314, 320, 323, 303; 375/235

(56) References Cited

U.S. PATENT DOCUMENTS

| 3,703,632 A | * | 11/1972 | Shanks ........................ 708/315 |
| 3,732,409 A | * | 5/1973 | Fletcher et al. .............. 708/300 |
| 4,136,398 A | * | 1/1979 | Eggermont ................... 708/301 |
| 4,323,980 A | * | 4/1982 | Houdard et al. ............. 708/316 |
| 4,388,693 A | * | 6/1983 | Nakayama .................... 708/301 |
| 4,805,129 A | * | 2/1989 | David .......................... 708/300 |
| 4,817,025 A | * | 3/1989 | Asai et al. ................... 708/301 |
| 5,367,476 A | * | 11/1994 | Elliott ......................... 708/301 |
| 5,392,230 A | * | 2/1995 | Christopher ................. 708/316 |
| 5,831,879 A | * | 11/1998 | Yom et al. ................... 708/301 |
| 6,188,723 B1 | * | 2/2001 | Lee et al. .................... 375/235 |
| 6,526,430 B1 | * | 2/2003 | Hung et al. .................. 708/523 |
| 6,529,926 B1 | * | 3/2003 | Capofreddi .................. 708/316 |

FOREIGN PATENT DOCUMENTS

WO   WO9806064   2/1998   ........... G06T 15/00

OTHER PUBLICATIONS

"Reconfigurable Hardware for Efficient Implementation of Programmable Fir Filters", Tracy C. Denk et al, published in ISCASSP, May 1998.

* cited by examiner

Primary Examiner—Kakali Chaki
Assistant Examiner—Chat Do

(57) ABSTRACT

The invention offers a method of calculating digital filters enabling to multiplex various different filters with the aid of a programmable co-processor circuit comprising a calculation element and memory registers. The invention comprises making an anticipated calculation of part of the result of the current filter before the last data included in the calculation of this result has arrived. For this purpose, successive products between predetermined filter coefficients and the corresponding input data which have already been used for the calculation of the preceding results are accumulated in an iterative fashion in an intermediate result in order to anticipate the calculation of the current result. The calculation of the last intermediate result for each final result is triggered each time a new input data is received, so that each filter result is immediately available once the last input data involved in this result has been received.

20 Claims, 2 Drawing Sheets

RECEIVER, PROGRAMMABLE CIRCUIT AND METHOD OF CALCULATING DIGITAL FILTERS

FIELD OF THE INVENTION

The invention relates to a programmable co-processor circuit intended to be associated to a main processor to form a digital filter with predetermined coefficients, which circuit comprises a calculation element controlled by a control element and receives input data so as to produce a sequence of filter results on the output.

The invention also relates to a digital television receiver comprising a demodulation block which includes a filter device.

The invention finally relates to a method of calculating filters for putting multiplexed digital filters with predetermined coefficients into effect with the aid of a programmable co-processor circuit.

The invention has many applications, notably in systems called "multimedia systems" for putting digital filters into effect while using, for example, a signal processor of the type DSP, with specialized algorithms.

BACKGROUND OF THE INVENTION

The article by T. C. Denk et al entitled "Reconfigurable hardware for efficient implementation of programmable FIR filters" published in ISCASSP, May 1998, described a finite impulse response filter architecture which enables to anticipate the calculation of a filter result before the arrival of the last data included in this result. For this purpose, the data already received are stored in view of being used in an anticipated intermediate calculation for the calculation of the current final result. This method implies that the speed of calculation of the filter processor is synchronized with the receiving speed of the data.

SUMMARY OF THE INVENTION

The invention describes a co-processor circuit which permits more flexibility than the known circuit for calculating digital filters. More particularly, it enables to multiplex various types of different filters, while the input rate of the data and the calculation speed of the processor are not linked to each other.

Therefore, a circuit is provided of the type defined in the opening paragraph, characterized in that the calculation element comprises an accumulator intended to sum up in an intermediate result successive products between received input data and the filter coefficients, so as to put an anticipated iterative calculation of the current filter result into effect, and in that the control element is provided for triggering the last iteration of said anticipated calculation of the current result upon reception of a new data.

According to a characteristic feature of the invention, a circuit as described above is provided for forming a filter having length L, while the sequence of filter results, denoted y(n), can be written as:

$$y(n) = \sum_{k=0}^{L-1} \omega_k \times x(n-k) \quad (1)$$

where y(n) is the result of the filter instant n, $\omega_k$ is the predetermined coefficient having index k, and x(n−k) is the input data received at the instant n−k, characterized in that, where p is a positive integer equal to the number of products to be calculated in parallel by the calculation element, the iterations of said anticipated calculation are effected before the last data included in the filter result y(n) arrives, while each iteration realizes the calculation of p products between p successive input data that have already been used for the calculation of the preceding filter result, denoted y(n−1), and the filter coefficients corresponding according to equation (1).

According to another characteristic feature of the invention, such a circuit is provided comprising a plurality of control elements co-operating with said calculation element and controlled by a centralized management element for putting various multiplexed digital filters into effect, characterized in that said management element comprises a priority indication associated to each filter for triggering the anticipated calculation of a filter result as a function of the priority of said filter.

According to a particular embodiment of the invention, each control element realizes a four-state automaton comprising:

an initialization state for storing the coefficients of each filter, an inactivity state for waiting for the arrival of a new input data, a state of anticipated iterative calculation intended to sum up in an intermediate result, with the aid of an iterative calculation, products between already received successive input data and the corresponding filter coefficients, a state of calculating the last iteration for calculating the last iteration of said anticipated iterative calculation of the current result.

According to an important characteristic feature of this embodiment, the centralized management element is provided for activating, each time a new input data is received, the calculation state of the last iteration of the filter which said new data is meant for.

The invention also provides a filter calculation method of the type defined in the opening paragraph, comprising the following steps:

an initialization step for storing the coefficients of each filter, an anticipated iterative calculation step intended to sum up in an intermediate result, with the aid of an iterative calculation, products between successively received input data and the coefficients of the corresponding filter, to anticipate the calculation of the current filter result, a step of calculating the last iteration triggered when each new input data is received for the calculation of the last iteration of the anticipated iterative calculation of the current result.

BRIEF DESCRIPTION OF THE DRAWINGS

These and other aspects of the invention are apparent from and will be elucidated, by way of non-limitative example, with reference to the embodiment(s) described hereinafter.

In the drawings.

DESCRIPTION OF THE EMBODIMENTS

Figure 1:
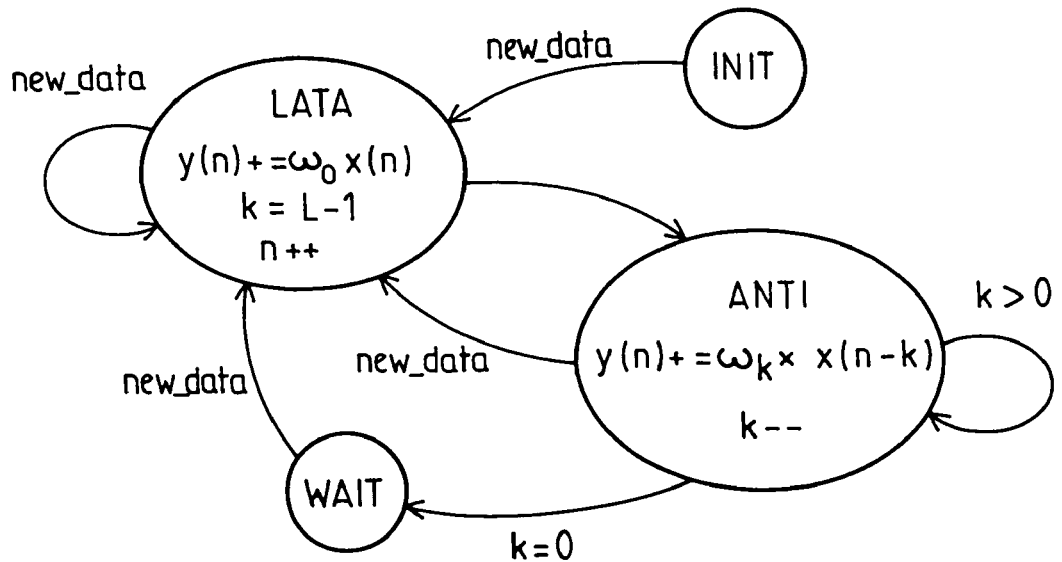
FIG. 1 represents the state diagram of an automaton to illustrate a filter calculation method according to the invention.

The invention notably applies to the calculation of digital finite impulse response filters and is highly advantageous in the case where various filters are multiplexed with the aid of a single main processor. The invention is compatible with the requirements of very large scale integration VLSI.

The demodulation algorithms used in digital telecommunications systems, such as digital cable or satellite television, require much calculation power, from which stems the idea of utilizing a co-processor circuit for relieving the main processor of filter calculations. The specialized programmable circuits may be formed, in essence, by a digital signal processor, or DSP, which comprises, inter alia, memory registers for storing the programmable coefficients of the filters.

The invention notably proposes a digital filter calculation method for multiplexing various types of different filters in an efficient manner. The problem consists of solving equation (1) below for each filter with minimum latency time.

$$y(n) = \sum_{k=0}^{L-1} \omega_k \times x(n-k) \quad (1)$$

where y(n) is the filter result at the instant n, L the filter length, $\omega_k$ the predetermined coefficient having index k, and x(n−k) the input data received at the instant n−k.

The calculation of a single filter result thus requires the calculation of L multiplications and a sum of L results. The method which consists of exactly calculating the equation (1) implies the storage of all the input data until the last data included in the current filter result is received. The major drawback of this method resides in the latency time between the reception of x(n) and the transmission of y(n) which is proportional to the filter length.

The invention proposes another method of calculating the equation (1), which consists of calculating part of the filter result y(n) in an anticipated manner, before the last data, denoted x(n), involved in the calculation y(n) is received, but after the preceding result, denoted y(n−1), has been calculated. For this purpose, the method comprises an accumulation step (also called iterative anticipated calculation step) for summing up in an intermediate result successive products between the predetermined coefficients of the filter and the corresponding input data according to equation (1), which have already been used for the calculation of preceding filter results. Each intermediate result, denoted y'(n), iteratively receives the sum of the previously calculated intermediate result and of the product of the most recent available data, that is x(n−k) with k∈ {L−1, . . . , 1}, which has been used for the calculation of the preceding filter result y(n−1), with the appropriate filter coefficient. This yields:

$y'(n) \leftarrow y'(n) + \omega_k \times x(n-k)$ with k∈{L−1, . . . ,1} where the sign ← indicates that the result to the left of the sign receives the value to the right.

If the processor is provided for processing various data in parallel in the form of words of p successive data, with P being an integer greater than or equal to 1, and L a multiple of p, the calculation of the intermediate result is thus written as:

$$y'(n) \leftarrow y'(n) + \sum_{k=i\times p-1}^{(i-1)\times p} \omega_k \times x(n-k)$$

with i ∈[L/p, . . . ,2}

An anticipated iterative calculation of the current filter result is then effected in successive accumulation steps according as the data arrive, so that while the last data x(n) arrives which is included in the calculation of the filter result y(n), there is only a last calculation step left for obtaining the final result y(n). This last step comprises a calculation of the product of x(n) with the corresponding predetermined coefficient denoted $\omega_0$ according to equation (1), and an addition of this product to the last accumulated intermediate result. This last step, called last iteration step, can be put into effect with a clock cycle whatever the length of the filter, which considerably improves the performance of the processor.

In the case mentioned previously, where the processor is provided for processing various data in parallel, where p is the number of data contained in a word, the calculation of the last iteration is then written as:

$$y(n) = y'(n) + \sum_{k=0}^{p-1} \omega_k \times x(n-k)$$

An initialization step is also provided for storing the filter coefficients as well as the first received data that the calculation of the first filter result can be started.

According to this method, the input rate of the data and the calculation speed of the processor may be independent, which also allows to multiplex various different filters.

FIG. 1 represents the state diagram of an automaton for performing the calculation of a filter according to the method described above. It comprises four states denoted INIT, WAIT, ANTI and LATA, where:

INIT is an initialization state for storing the filter coefficients,

ANTI is an anticipated iterative calculation state intended to sum up in an intermediate result, with the aid of an iterative calculation, products between already received successive input data and the corresponding filter coefficients, which boils down to anticipating a partial calculation of the current result with the aid of already available received data, WAIT is a state of inactivity in which the processor is situated when it no longer has anything to do while it is waiting for the arrival of a new input data, for example, when all the anticipated iterative calculations of the current result have been made in the state ANTI, LATA corresponds to the calculation state of the last iteration of the anticipated calculation of the current result; it is triggered when a new input data is received.

The calculation of the last iteration of the current intermediate result is thus synchronized with the reception of each new input data. Therefore, the automaton is provided for passing to the state LATA from any of the four possible states in response to a single particular event: the reception of a new input data (new_data). It remains in this state as long as it receives data. Thus in the state LATA the processor calculates the last iteration of the calculation of the final result y(n) so as to send this result to the output of the filter. While the new input data is denoted x(n), the calculation of the last iteration comprises a calculation of the product $\omega_0 \times x(n)$ and then the addition thereof to the intermediate result calculated previously, denoted $y_1'(n)$.

If the processor does not receive a new input data from the state LATA onwards, it is automatically placed in the state ANTI to anticipate the calculation of the next filter result y(n+1) by iterating the calculation of the intermediate result y'(n+1) with the aid of data which are already available. For $i \in \{1, \ldots, L\}$ and k=L−i, the $i^{th}$ iteration of the intermediate result intended for the calculation of the result y(n+1), denoted $y_i'(n+1)$ is written as:

$$y_i'(n+1) \leftarrow y_{i-1}'(n+1) + \omega_k \times x(n-k)$$

$$y_0'(n+1) = 0$$

where the sign ← indicates that the result to the left of the sign receives the value to the right. The index k is decremented after each iteration of the anticipated calculation (k−), as long as k remains strictly positive (k>0). When k becomes zero and if no new data is received, the intermediate result calculated previously then being denoted $y_{L-1}'(n+1)$, the processor is automatically put in the state WAIT to wait for the next input data x(n+1), which will permit to terminate the calculation of the result y(n+1).

Summarizing, whatever the current state of the processor, it is automatically put in the state LATA when a new input data is received. In the mean time, once the initialization phase INIT has been finished, it may be either in the state ANTI, as long as all the iterations of the anticipated calculation of the next result are not terminated, or in the state WAIT, when all the anticipated calculations in which available data are involved, which have already been used for calculating the previous filter results, are finished.

Figure 2:
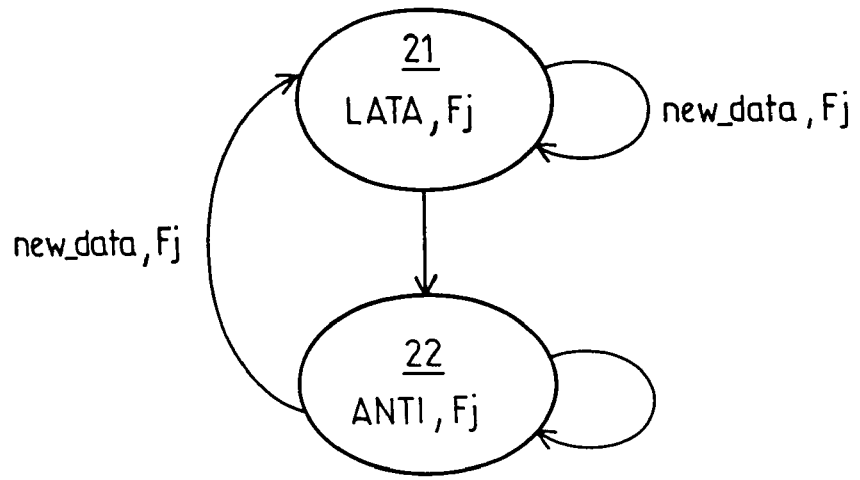
FIG. 2 is a diagram to illustrate the operation of the centralized management element according to the invention.

FIG. 2 shows the state diagram of a centralized management element or also organizer for organizing the calculations between various multiplexed independent digital filters. Each filter is controlled by a control element or independent automaton, functioning, for example, in accordance with the four-state machine described above with reference to FIG. 1. The organizer assigns a priority index to each filter so as to optimize the organization of the calculations.

According to the embodiment represented in FIG. 2, the organizer comprises two states numbered 21 and 22. The reception of an input data meant for a defined filter, denoted Fj, puts the organizer in state 21, which triggers the calculation state of the last iteration LATA for the filter under consideration. The triggering event is represented in the Figure by the arrows carrying the reference new_data Fj. The rest of the time the organizer is in the state 22 to trigger the anticipated calculation state ANTI of the various filters depending on their degree of priority.

For efficiently managing these calculations, the organizer and the state machine must know the particular context of each filter, that is to say, the type of processed data, the type of filter, the position of the read and write pointers, etc. The organizer interrupts the anticipated calculation of a filter, even if this is not terminated, to trigger the calculation of the last iteration for another filter whatever its priority if a new data for this other filter is received.

If no new data is received, the organizer triggers the anticipated calculation of the filter that has the highest priority while waiting for the reception of a new input data.

Figure 3:
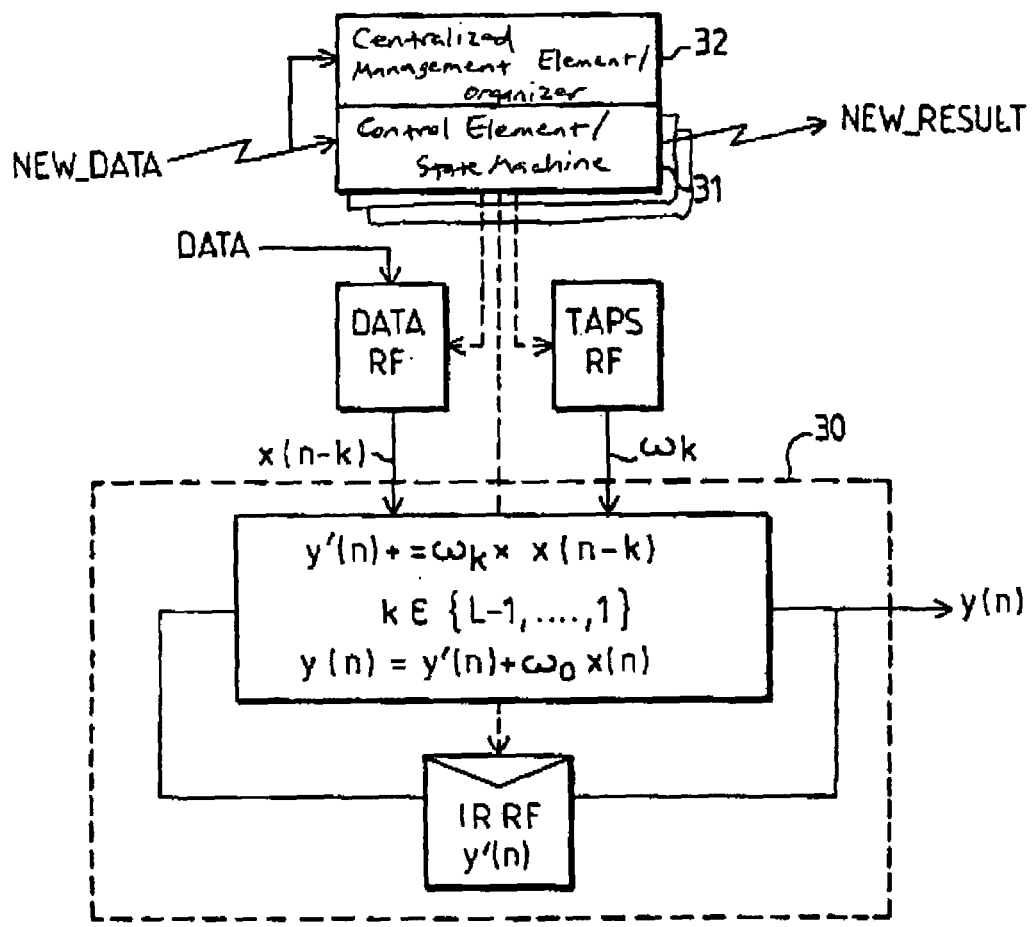
FIG. 3 represents the block diagram of a co-processor circuit according to the invention.

A filter processor according to the invention is represented in the form of a block diagram in FIG. 3. It comprises the following elements:

memory registers DATA RF and TAPS RF for storing respectively, the input data before they are used in the calculations and the predetermined coefficients of the various filters, a calculation element 30 having inputs for receiving the data and the coefficients stored in the registers DATA RF and TAPS RF formed, in essence, by a multiplier, an adder and n summing-up registers IR RF for n multiplexed filters (for clarity, a single register is represented in FIG. 3), each summing-up register being intended to sum up in an intermediate result, in accordance with an iterative calculation, successive products between the input data and the stored coefficients, a control element or state machine 31 associated to each filter, for controlling the various blocks cited above, a centralized management element or organizer 32 for controlling the state machines of the various filters.

During the initialization state INIT, the coefficients of each filter are stored in the register TAPS RF while the first received data (their number being equal to the filter length, that is to say, to the number of coefficients) are stored in the register DATA RF. Each state machine 31 sends a control signal to the memory registers DATA RF and TAPS RF for controlling the storage of the data. When they are received, the input data DATA are then stored in the register DATA RF in view of being used by the calculation element 30.

Each time new input data DATA is received, the state machine of the destination filter of the data receives a control signal NEW_DATA to activate the calculation state of the last iteration LATA. The state machine then generates a signal NEW_RESULT to indicate that a new filter result y(n) is available on the output and to re-initialize the summing-up register IR RF which has contained the successive iterations of the intermediate results anticipated for the result y(n). In the states LATA and ANTI, control signals drawn in broken lines in FIG. 3 are sent to the registers DATA RF and TAPS RF so that they deliver to the calculation element the data necessary for the calculations performed in these two states.

Figure 4:
FIG. 4 represents a digital television receiver according to the invention.

FIG. 4 shows, by way of example of embodiment, a general diagram of a digital television receiver or set top box intended to ensure the decoding of the data frames transmitted over a transmission channel. It comprises:

a block TUNER comprising a tuner for receiving an analog input signal and converting it to a lower intermediate frequency, a demodulation block DEMOD for digitizing the received analog signal and demodulating it to ensure the synchronization of the data that form the signal by way of digital data frames, an error correction block FEC (Forward Error Correction) for correcting the transmission errors caused by the channel, a source decoding block MPEG utilizing, for example, a decoder according to the MPEG standard for decoding the received message, and a display block TV notably comprising a cathode ray tube.

A digital filtering is necessary to ensure the function of the demodulator 42. This may be realized in an advantageous manner with the aid of a circuit of the type as represented in FIG. 3.

Thus have been described and illustrated with the aid of examples a receiver, a filter processor circuit and a digital filter calculation method permitting the multiplexing of various types of filters which are notably intended to receive data that have varied formats and input rates. Obviously, without leaving the scope of the invention, many variants may be provided in the modes of embodiment described.

What is claimed is:

1. A programmable co-processor circuit associated to a main processor to form a digital filter with predetermined coefficients, the programmable co-processor circuit comprising:
  a calculation element capable of being controlled by a control element and receiving input data so as to produce a sequence of filter results on an output,
  wherein the calculation element comprises an accumulator capable of summing up, in an intermediate result, successive products between received input data and the filter coefficients so as to realize an anticipated iterative calculation of a current filter result, and
  wherein the control element is capable of triggering a last iteration of said anticipated calculation of the current result upon reception of a new data.

2. A circuit as claimed in claim 1, wherein:
  the digital filter has a length L,
  the sequence of filter results denoted y(n) is written as:

$$y(n) = \sum_{k=0}^{L-1} \omega_k \times x(n-k) \quad (1)$$

where y(n) is a result of a filter instant n, $\epsilon_k$ is the predetermined coefficient having index k, and x(n−k) is input data received at an instant n−k, and
  wherein, assuming p is a positive integer equal to a number of products to be calculated in parallel by the calculation element, iterations of said anticipated calculation are effected before a last data included in the filter result y(n) arrives, while each iteration realizes a calculation of p products between p successive input data that have already been used for the calculation of a preceding filter result, denoted $y_{n-1}$, and the filter coefficients corresponding according to equation (1).

3. A digital television receiver to receive digital input data, comprising a demodulation block which includes a filter device, wherein said filter device comprises a circuit as claimed in claim 1 for filtering the received data.

4. A digital television receiver as claimed in claim 3, further comprising:
  a tuner coupled to the demodulation block;
  an error correction block coupled to the demodulation block;
  a decoding block coupled to the error correction block; and
  a display coupled to the decoding block.

5. A circuit as claimed in claim 1, comprising a plurality of control elements co-operating with said calculation element and controlled by a centralized management element for putting various multiplexed digital filters into effect,
  wherein said management element is capable of using a priority indication associated to each filter to trigger the anticipated calculation of a filter.

6. A circuit as claimed in claim 5, wherein each control element realizes a four-state automaton comprising:
  an initialization state for storing the coefficients of each filter,
  an inactivity state for waiting for arrival of a new input data,
  a state of anticipated iterative calculation to sum up in an intermediate result, with an aid of an iterative calculation, products between already received successive input data and the corresponding filter coefficients, and
  a state of calculating a last iteration for calculating the last iteration of said anticipated iterative calculation of the current result.

7. A circuit as claimed in claim 6, wherein said centralized management element is provided for activating, when each new input data is received, the calculation state of the last iteration of the filter which said new data is meant for.

8. A calculation method for putting multiplexed digital filters with predetermined coefficients into effect with an aid of a programmable co-processor circuit to receive input data and produce on an output a sequence of filter results, wherein the method comprises:
  an initialization step for storing said coefficients of each filter,
  an anticipated iterative calculation step to sum up in an intermediate result, with an aid of an iterative calculation, products between successively received input data and said coefficients of a corresponding filter, to anticipate a calculation of a current filter result, and
  a step of calculating a last iteration triggered when each new input data is received for a calculation of said last iteration of the anticipated iterative calculation of the current result.

9. A circuit as claimed in claim 1, further comprising a plurality of registers capable of storing the coefficients.

10. A circuit as claimed in claim 1, wherein an input rate of the input data is different from a calculation speed of the programmable co-processor circuit.

11. A circuit, comprising:
  a memory capable of storing input data and a plurality of digital filter coefficients, the input data comprising a plurality of first data values and a last data value; and
  a calculation element coupled to the memory, the calculation element capable of calculating a filter result by:
  iteratively summing products between the first data values and the digital filter coefficients before the last data value is received; and
  performing a last iteration after the last data value is received to produce the filter result upon reception of new data.

12. The circuit of claim 11, further comprising a control element capable of controlling the circuit.

13. The circuit of claim 12, wherein the control element implements a four-state automaton for controlling the circuit, the four-state automaton comprising:
  an initialization state associated with storing the digital filter coefficients in the memory;
  an inactivity state associated with waiting for arrival of one of the data values;
  an anticipated iterative calculation state associated with iteratively summing the products; and
  a last iteration calculation state associated with performing the last iteration.

14. The circuit of claim 11, wherein the memory is capable of storing digital filter coefficients for a plurality of different digital filters; and
  further comprising a plurality of control elements capable of controlling the circuit to implement the different digital filters.

15. The circuit of claim 14, wherein each of the control elements implements a four-state automaton for controlling the circuit; and further comprising a central management element for controlling the control elements.

16. The circuit of claim 11, wherein the filter result comprises one of a sequence of filter results; and
the sequence of filter results is defined using a formula of:

$$y(n) = \sum_{k=0}^{L-1} \omega_k \times x(n-k)$$

where y(n) represents the n-th filter result, L represents a filter length, $\omega_k$ represents the k-th digital filter coefficient, and x(n−k) represents the (n−k)-th data value.

17. The circuit of claim 11, wherein:
the calculation element is capable of producing a plurality of intermediate results including a last intermediate result when iteratively summing the products;
the calculation element is capable of using the last intermediate result to produce the filter result when performing the last iteration; and
the calculation element is capable of processing p successive data values in parallel, where p is greater than or equal to one.

18. The circuit of claim 17, wherein the filter result identified during the last iteration is determined using a formula of:

$$y(n) = y'(n) + \sum_{k=0}^{p-1} \omega_k \times x(n-k)$$

where y(n) represents the n-th filter result.

19. The circuit of claim 11, wherein the calculation element comprises:
a multiplier;
an adder; and
a plurality of summing-up registers.

20. The circuit of claim 11, wherein the memory comprises a plurality of registers.

* * * * *